United States Patent
Abe (10) Patent No.: US 7,486,089 B2
(45) Date of Patent: Feb. 3, 2009

(54) METHOD FOR CONTROLLING PARALLELISM BETWEEN PROBE CARD AND MOUNTING TABLE, STORAGE MEDIUM STORING INSPECTION PROGRAM, AND INSPECTION APPARATUS

(75) Inventor: Hironobu Abe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/517,248

(22) Filed: Sep. 8, 2006

(65) Prior Publication Data

US 2007/0057683 A1    Mar. 15, 2007

(30) Foreign Application Priority Data

Sep. 9, 2005    (JP) .............................. 2005-261985

(51) Int. Cl.
*G01R 31/02*    (2006.01)

(52) U.S. Cl. ...................................... 324/754

(58) Field of Classification Search ................. 324/754
See application file for complete search history.

(56) References Cited

U.S. PATENT DOCUMENTS

| | | | | |
|---|---|---|---|---|
| 5,861,759 A | * | 1/1999 | Bialobrodski et al. | 324/754 |
| 6,963,208 B2 | * | 11/2005 | Fukasawa et al. | 324/754 |

* cited by examiner

*Primary Examiner*—Ha Tran T Nguyen
*Assistant Examiner*—Shaun Campbell
(74) *Attorney, Agent, or Firm*—Oblon, Spivak, McClelland, Maier & Neustadt, P.C.

(57) ABSTRACT

In a method for controlling a parallelism between a probe card having a number of probe pins and a mounting table, first, among the probe pins, one or more probe pins corresponding to each of plural distinct locations on an X-Y coordinate system whose origin lies at a probe center are selected. Then, a tip of each of the selected probe pins is detected to obtain position coordinates (X,Y,Z) thereof. Thereafter, a specific point on each of connection lines connecting tips of neighboring selected probe pins is selected and their position coordinates on the connection lines are calculated, wherein the position coordinates of the specific points are set as position coordinates (X,Y,Z) of tips of imaginary probe pins. Subsequently, the parallelism between the probe card and the mounting table based on the position coordinates (X,Y,Z) of the tips of the imaginary probe pins is adjusted.

14 Claims, 8 Drawing Sheets

METHOD FOR CONTROLLING PARALLELISM BETWEEN PROBE CARD AND MOUNTING TABLE, STORAGE MEDIUM STORING INSPECTION PROGRAM, AND INSPECTION APPARATUS

FIELD OF THE INVENTION

The present invention relates to a method for adjusting a parallelism between a probe card and a mounting table to inspect electrical characteristics of a target object such as a wafer by bringing the probe card into contact with the target object; and, more particularly, to a method for automatically adjusting the parallelism between the probe card and the mounting table, a storage medium storing therein an inspection program for executing the method, and an inspection apparatus.

BACKGROUND OF THE INVENTION

Figure 9:
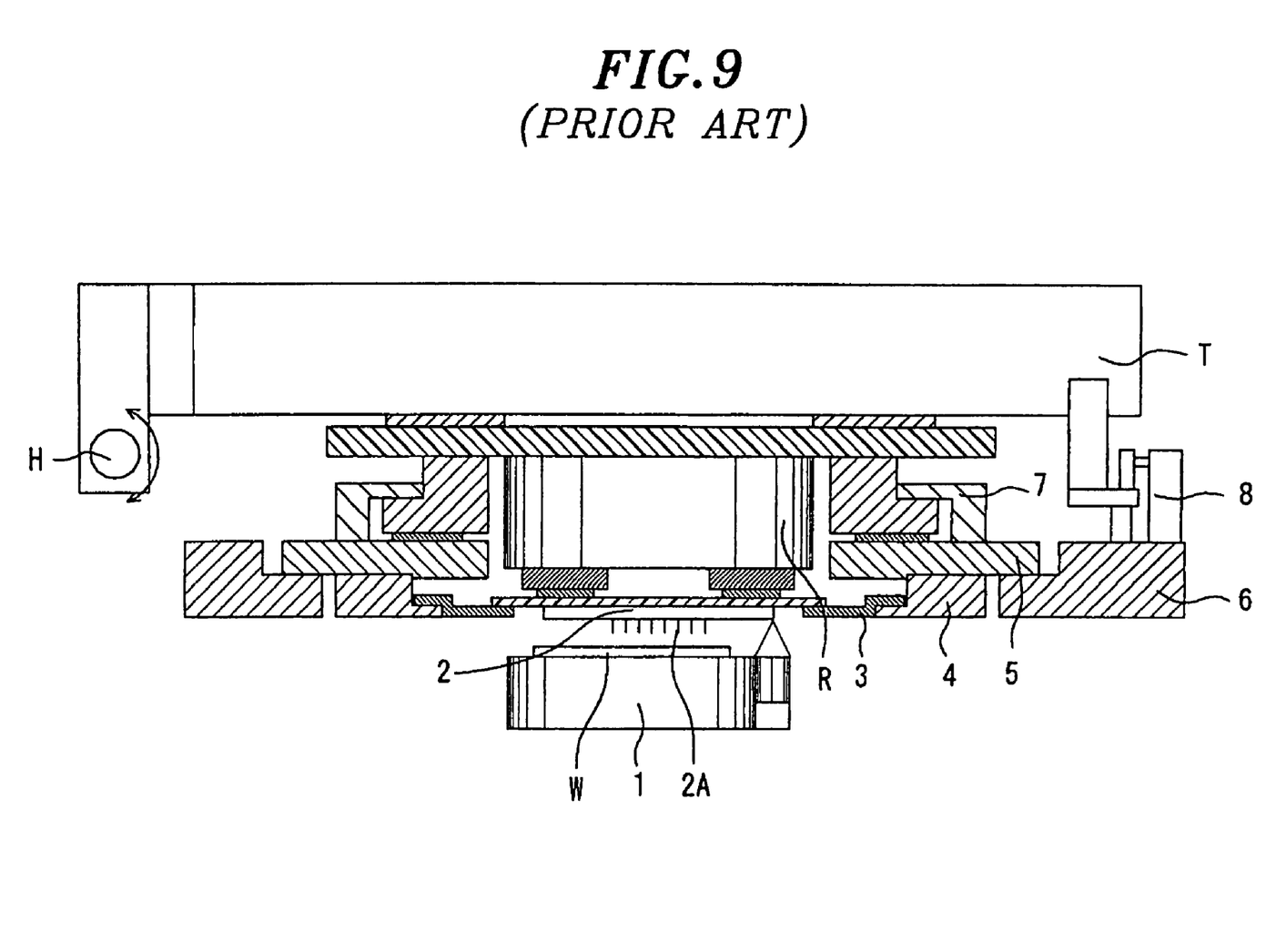
FIG. 9 provides a front view showing major components of a conventional inspection apparatus.

A conventional probe apparatus includes a loader chamber for transferring a target object (e.g., a wafer) and a prober chamber for inspecting electrical characteristics of the wafer transferred thereto from the loader chamber. As illustrated in FIG. 9, the prober chamber includes: a mounting table (wafer chuck) 1 for mounting a target object (wafer) W thereon and being movable in X, Y and Z directions; a probe card 2 disposed to be located above the wafer chuck 1 and provided with a number of probe pins 2A; a card clamp mechanism 4 detachably fastening the probe card 2 via a card holder 3; an insert ring 5 supporting the probe card 2 via the card clamp mechanism 4; a head plate 6 supporting the insert ring 5; a docking mechanism 7 for electrically connecting the probe card 2 to a connection ring R of a test head T; and a test head clamp mechanism 8 fastening the test head T on the head plate 6. The test head T connected to the probe card 2 via the docking mechanism 7 is configured to be rotated via a hinge H provided on a side portion of the probe apparatus.

Recently, with the development of the probe card 2, there is a strong demand for a whole contact type inspection apparatus allowing a whole contact between the probe card 2 and the wafer W at a time. In the whole contact type inspection apparatus, parallelism between the probe card 2 and the wafer W is a very important factor for determining reliability of inspection. That is, if the parallelism between the probe card 2 and the wafer W is poor, the probe pins 2A of the probe card 2 cannot make a contact with the wafer W under a proper and uniform needle pressure, resulting in deterioration of inspection reliability. Moreover, the poor parallelism between the probe card 2 and the wafer W can sometimes cause damages to the probe card 2 or the wafer W.

For the reasons, various techniques for controlling parallelism between a probe card and a wafer have been proposed, and some of those techniques are disclosed in References 1 to 4.

In Reference 1 (Japanese Patent Laid-open Application No. H06-021166), a piezoelectric device is inserted into a chuck top, and a top end stage of the chuck top is slanted. Further, a DUT (Device Under Test) board having a probe card thereon is made to be slanted by using the piezoelectric device or an actuator (a rotary screw or the like). The slope of the probe card is detected by employing a non-contact type method, for example, by irradiating laser beams to the probe card. When using laser, the slope of the probe card is detected by irradiating laser beams to the peripheral portion of the probe card and detecting the heights thereof at more than two points thereon.

Further, the technique disclosed in Reference 2 (Japanese Patent Laid-open Application No. H11-251379) includes: an XY-direction driving unit for moving a wafer stage in X-direction and Y-direction; a Z-direction driving unit for moving the wafer stage in Z-direction; and a slope control unit disposed between the XY-direction driving unit and the Z-direction driving unit, for controlling a slope of the wafer stage with respect to a horizontal plane. When controlling the slope of the wafer stage, tip heights of four probe needles located on four corners of a probe card is detected by using a self-focusing camera, and the slope of the probe card with respect to the wafer stage is calculated based on differences between the detected tip heights.

Disclosed in Reference 3 (Japanese Patent Laid-open Application No. H07-231018) is an invention including: a contact-type displacement sensor for detecting tip heights of probe needles at plural locations on a probe card; a detection circuit for detecting a voltage variation of the displacement sensor; a control system for calculating slopes and slope directions of tip heights of the probe needle group based on the detection result from the detection circuit and outputting an instruction for correction; and a slope correction unit supporting an insert ring at three points and serving to correct the slopes of the tip heights of the probe needles by varying the supporting heights of the insert ring at the three points of the insert ring individually. In this configuration, after detecting tip heights of the probe needles at the plural locations (e.g., four locations in left-and-right and back-and-forth directions) on the probe card, slopes and slope directions of the tip heights of the probe needle group are calculated by using calculation software stored in a control system in advance. Further, in addition to the slopes of the probe needles, the slope of a wafer can also be measured, in which case the slope correction can be performed based on the two data. Moreover, Reference 4 (Japanese Patent Laid-open Application No. H08-162509) also discloses a technique for adjusting the slope of a wafer chuck, which is similar to the method described in Reference 3.

Though References 1 to 4 disclose various methods for adjusting a parallelism between a probe card and a wafer stage, those methods are all directed to measuring tip heights of a probe card or heights of the probe card at plural points thereof, calculating a slope of the probe card based on the measurements; modifying the slope of one of the probe card and the wafer stage to be made identical with the slope of the other, to thereby adjust the parallelism therebetween. However, any of those techniques in References 1 to 4 does not clearly disclose any specific method for adjusting the parallelism between the probe card and the wafer stage, and if any, the method requires a high level of skills or takes up much time.

SUMMARY OF THE INVENTION

It is, therefore, an object of the present invention to provide a method for adjusting parallelism between a probe card and a mounting table simply and promptly just by measuring tip heights of probe pins located at plural locations on the probe card and a storage medium storing an inspection program, and an inspection apparatus.

In accordance with an aspect of the present invention, there is provided a method for controlling a parallelism between a probe card and a mounting table when inspecting electrical characteristics of a target object by allowing the probe card having a number of probe pins to electrically contact the target object on the mounting table, the method including: a first step of selecting, among the probe pins, one or more probe pins corresponding to each of plural distinct locations on an X-Y coordinate system whose origin lies at a probe center; a second step of detecting a tip of each of the selected probe pins and obtaining position coordinates (X,Y,Z) thereof; a third step of selecting a specific point on each of connection lines connecting tips of neighboring selected probe pins and calculating position coordinates of the specific points on the connection lines, wherein the position coordinates of the specific points are set as position coordinates (X,Y,Z) of tips of imaginary probe pins; and a fourth step of adjusting the parallelism between the probe card and the mounting table based on the position coordinates (X,Y,Z) of the tips of the imaginary probe pins.

Preferably, the fourth step has the steps of: calculating a slope of the probe card with respect to the mounting table based on the position coordinates (X,Y,Z) of the imaginary probe pins; and adjusting the parallelism between the probe card and the mounting table based on the calculated slope.

Preferably, in the first step, probe pins are respectively selected from a first to a fourth quadrant of the X-Y coordinate system; in the second step, position coordinates (X,Y,Z) of tips of the probe pins selected from the first to the fourth quadrant are obtained; in the third step, two intersection points of connection lines connecting the tips of the selected probe pins with each of an X-Z plane and a Y-Z plane relative to the X-Y coordinate system are selected as the specific points and position coordinates of the intersection points on the X-Z and the Y-Z plane are calculated and set as the position coordinates (X,Y,Z) of the tips of imaginary probe pins; and in the fourth step, Z-coordinate values of the tips of the imaginary probe pins on the X-Z and the Y-Z plane are adjusted to be made identical.

Preferably, the method further includes, between the third and the fourth step, the step of calculating a difference of Z-coordinate values of the tips of the imaginary probe pins on the X-Z plane and a difference of Z-coordinate values of the tips of the imaginary probe pins on the Y-Z plane.

Preferably, in the third step, middle points of line segments connecting the tips of the neighboring probe pins are selected as the specific points and position coordinates of the middle points are calculated and set as the position coordinates (X,Y,Z) of the tips of the imaginary probe pins; and in the fourth step, a relational expression representing an imaginary plane including the tips of the imaginary probe pins is obtained and a parallelism between the imaginary plane and the mounting table is adjusted by using the relational expression.

Preferably, in the first step, two or more probe pins are selected from each of the distinct locations; and the method further comprising, between the second and the third step, the step of obtaining average position coordinates (X,Y,Z) of tips of the two or more probe pins and setting the average position coordinates (X,Y,Z) as position coordinates of the tips of the probe pins to be used in constructing the connecting lines in the third step.

In accordance with another aspect of the present invention, there is provided a storage medium storing an inspection program for driving a computer to adjust a parallelism between a probe card and a mounting table when inspecting electrical characteristics of a target object by allowing the probe card having a number of probe pins to contact the target object on the mounting table, wherein the inspection program drives the computer to execute a method including: a first step of selecting, among the probe pins, one or more probe pins corresponding to each of plural distinct locations on an X-Y coordinate system whose origin lies at a probe center; a second step of detecting a tip of each of the selected probe pins and obtaining position coordinates (X,Y,Z) thereof; a third step of selecting a specific point on each of connection lines connecting tips of neighboring selected probe pins and calculating position coordinates of the specific points on the connection lines, wherein the position coordinates of the specific points are set as position coordinates (X,Y,Z) of tips of imaginary probe pins; and a fourth step of adjusting the parallelism between the probe card and the mounting table based on the position coordinates (X,Y,Z) of the tips of the imaginary probe pins.

In accordance with still another aspect of the present invention, there is provided an inspection apparatus including: an insert ring for supporting a probe card provided with a number of probe pins; a head plate supporting the insert ring; a probe card adjusting mechanism, disposed between the insert ring and the head plate, for adjusting a parallelism between the probe card and a mounting table located below the probe card; a detection unit for detecting positions of tips of the probe pins; and a controller storing an inspection program for controlling the probe card adjusting mechanism based on a detection result from the detection unit, wherein the probe card adjusting mechanism has: a first support mechanism supporting a part of the insert ring; and plural second support mechanisms, respectively disposed apart from the first support mechanism along a circumferential direction of the insert ring, for supporting other parts of the insert ring, each of the second support mechanisms having a wedge member for elevating the insert ring, the wedge member being installed on the head plate; and the controller drives the probe card adjusting mechanism based on the inspection program to thereby execute the method for adjusting the parallelism between the probe card and the mounting table described above.

Preferably, the first support mechanism is disposed on a Y-Z plane of an X-Y-Z coordinate system whose origin lies on the probe center, and the second support mechanisms are disposed symmetrically with respect to the Y-Z plane of the X-Y-Z coordinate system.

In accordance with present invention, there are provided a method for adjusting parallelism between a probe card and a mounting table simply and promptly just by measuring tip heights of probe pins located at plural locations on the probe card and a storage medium storing an inspection program, and an inspection apparatus.

BRIEF DESCRIPTION OF THE DRAWINGS

The above and other objects and features of the present invention will become apparent from the following description of preferred embodiments given in conjunction with the accompanying drawings, in which:

FIG. 6A illustrates an arrangement of tips of probe pins on X-Y coordinate system and FIG. 6B sets forth a conceptual view showing connection lines between the probe pins and their points of intersection with an X-Z plane or a Y-Z plane to explain the method for adjusting the parallelism between the probe card and the mounting table in accordance with the first preferred embodiment of the present invention;

DETAILED DESCRIPTION OF THE PREFERRED EMBODIMENTS

Figure 1:
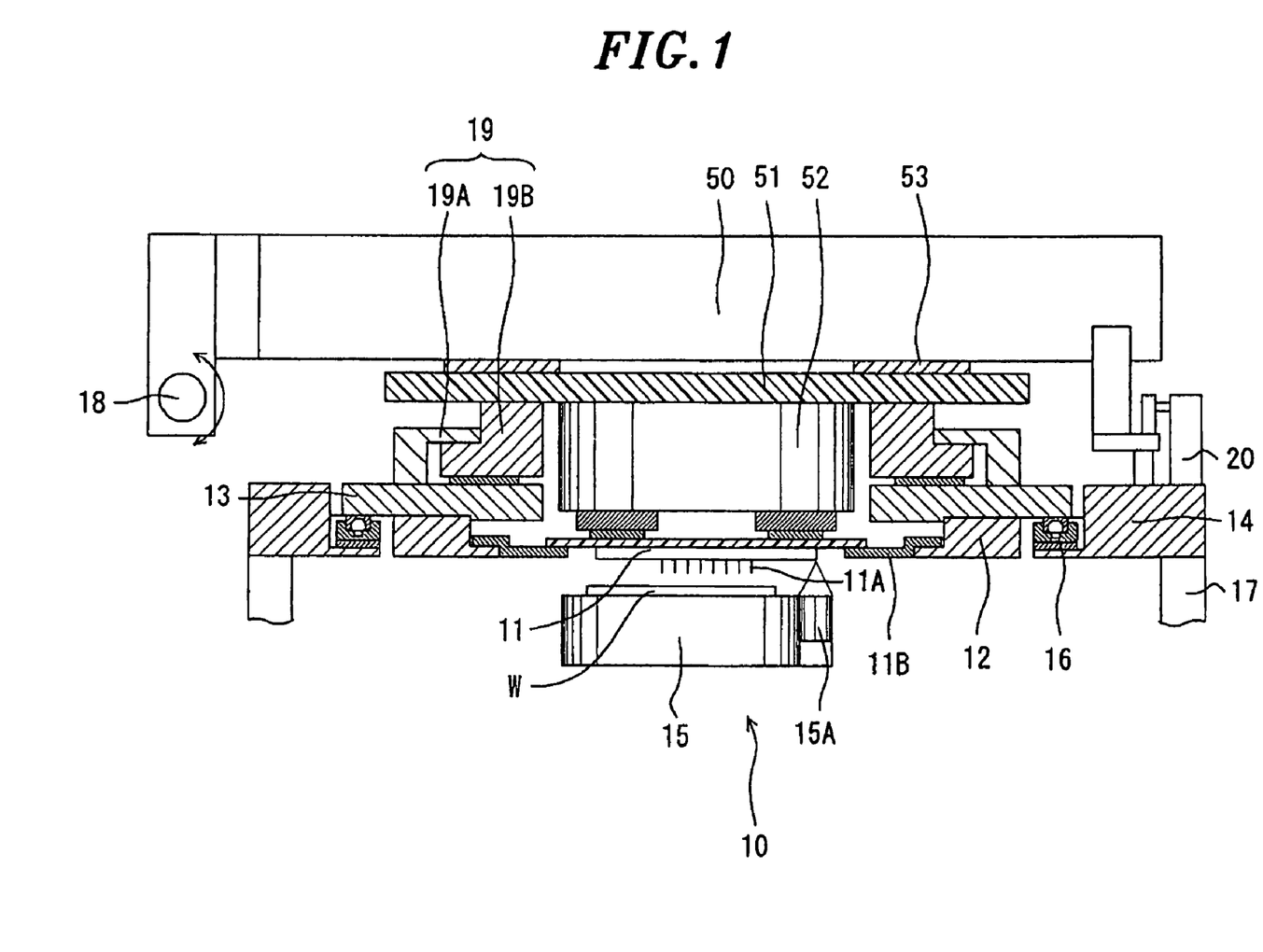
FIG. 1 is a cross sectional view showing major components of an inspection apparatus in accordance with a first preferred embodiment of the present invention.
Figure 2:
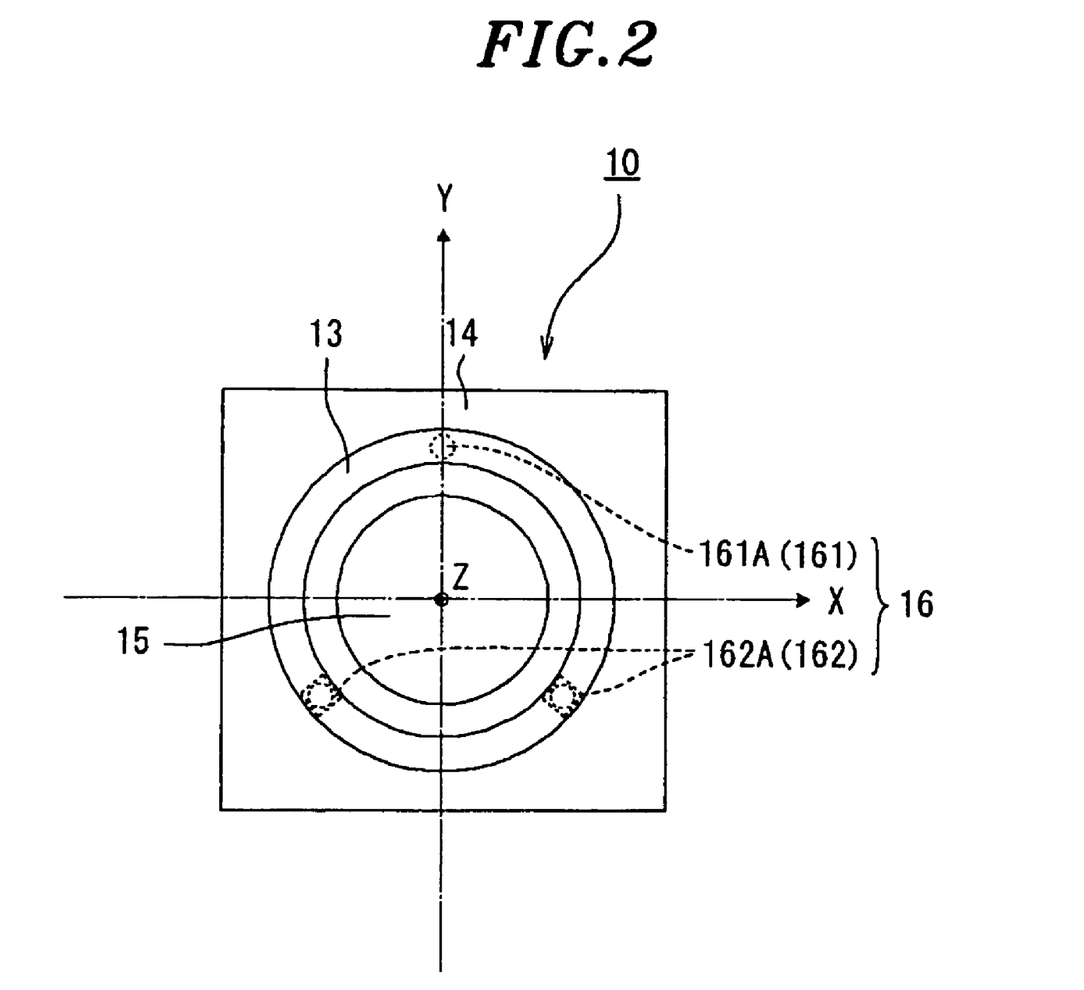
FIG. 2 sets forth a plane view illustrating a probe card adjusting mechanism of the inspection apparatus shown in FIG. 1.
Figure 3A:
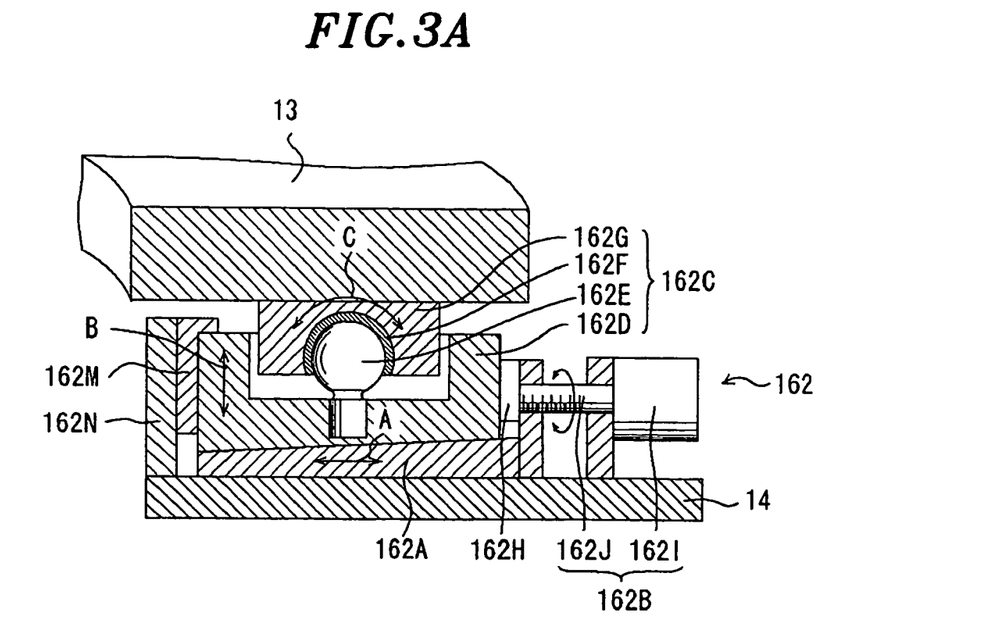
FIGS. 3A and 3B present a cross sectional view and a plane view describing the probe card adjusting mechanism shown in FIG. 2, respectively.
Figure 3B:
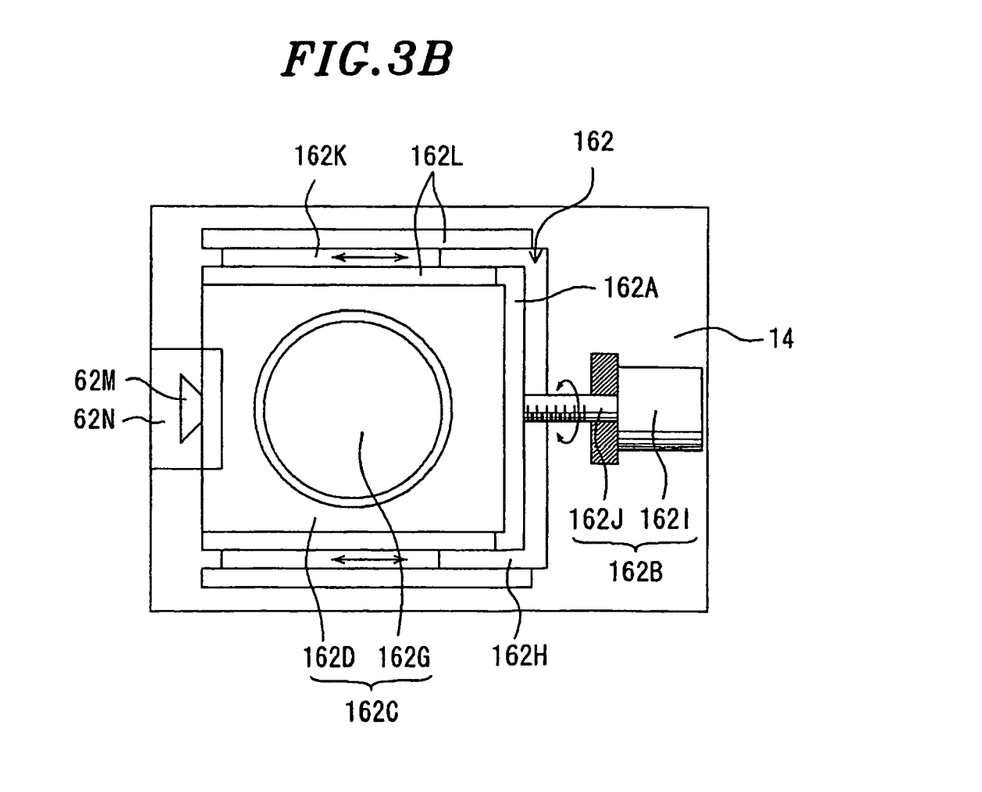
Figure 4:
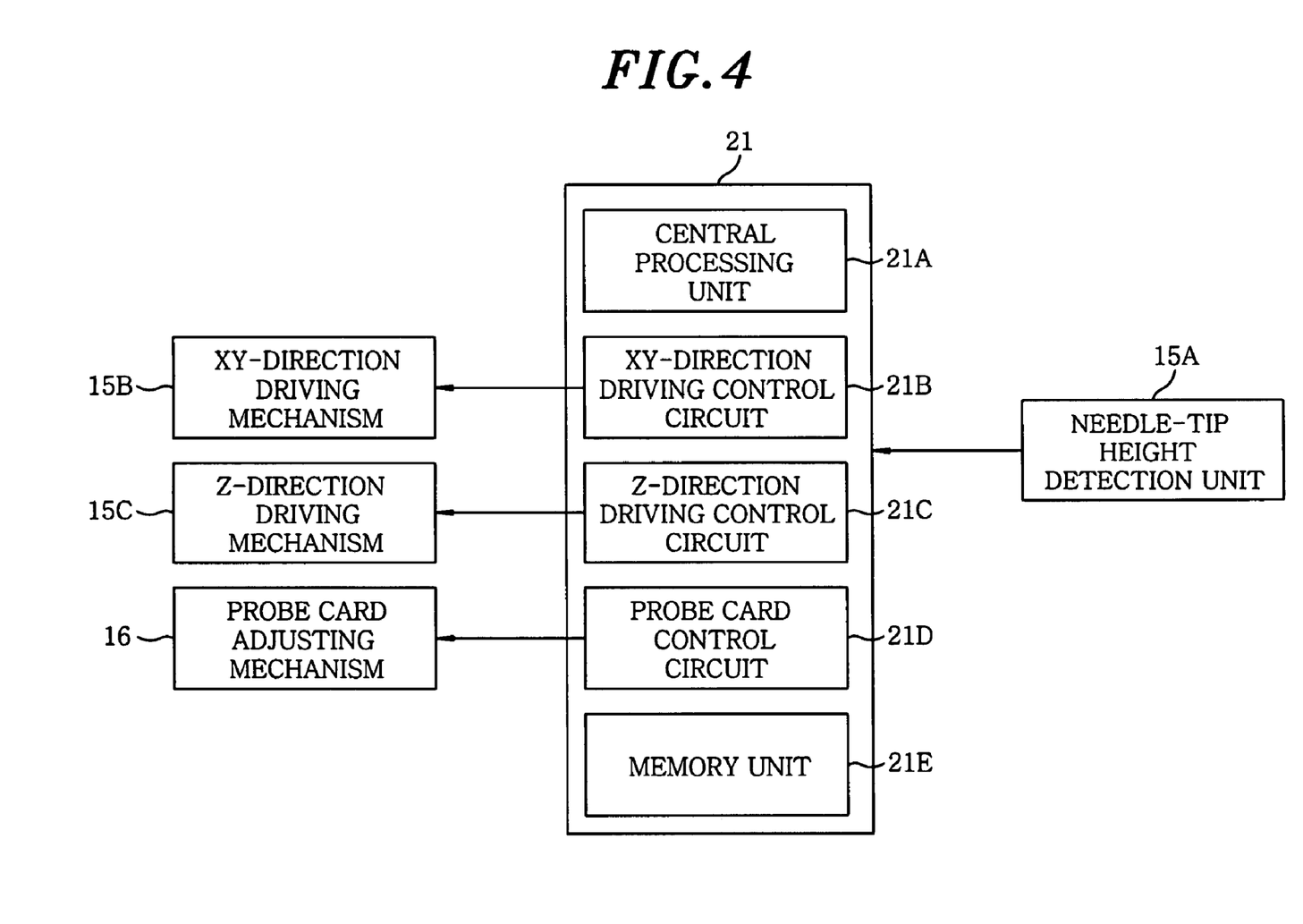
FIG. 4 provides a block diagram showing major components of the inspection apparatus shown in FIG. 1.
Figure 5:
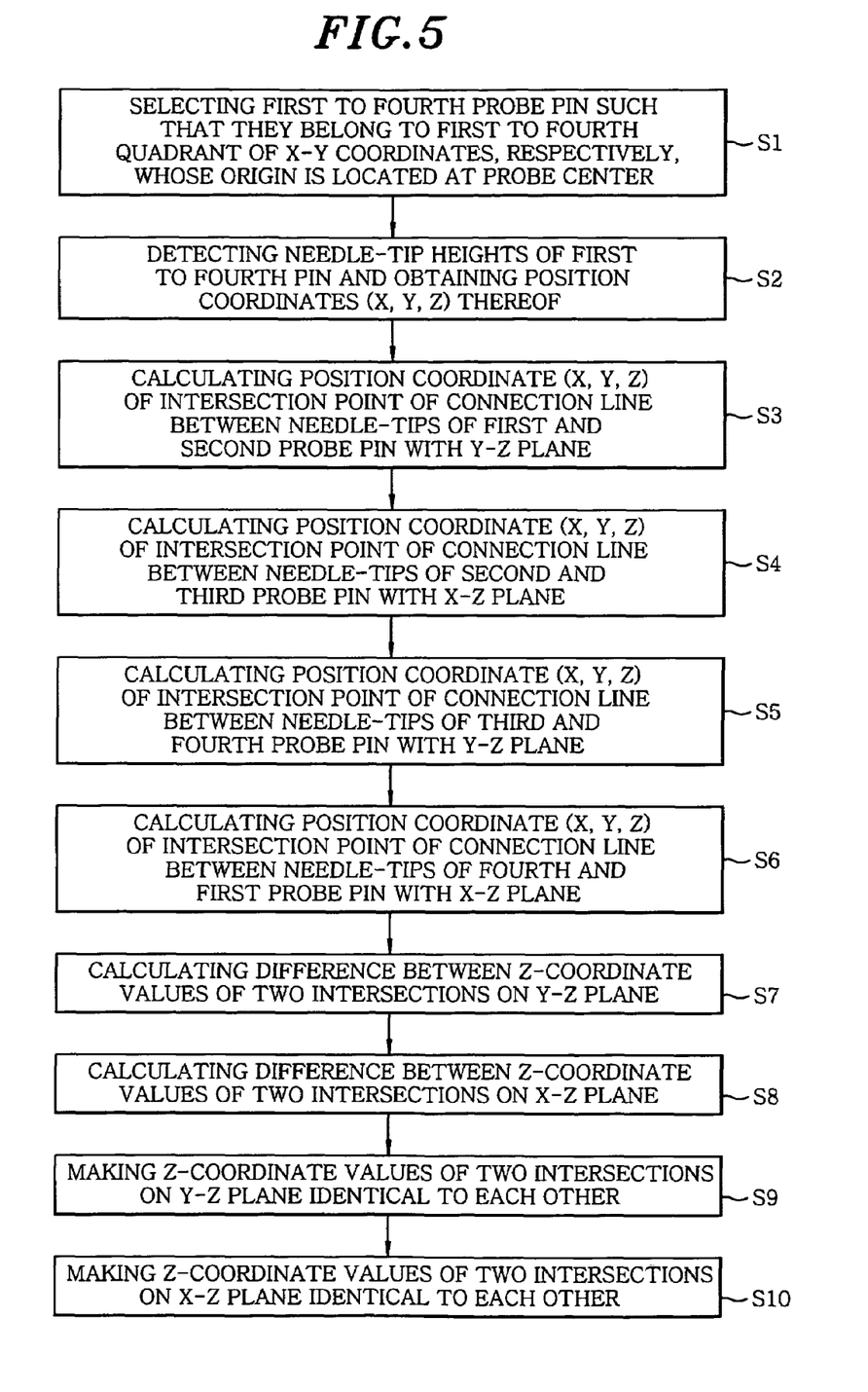
FIG. 5 depicts a flow chart describing a method for adjusting a parallelism between a probe card and a mounting table in accordance with the first preferred embodiment of the present invention.
Figure 6A:
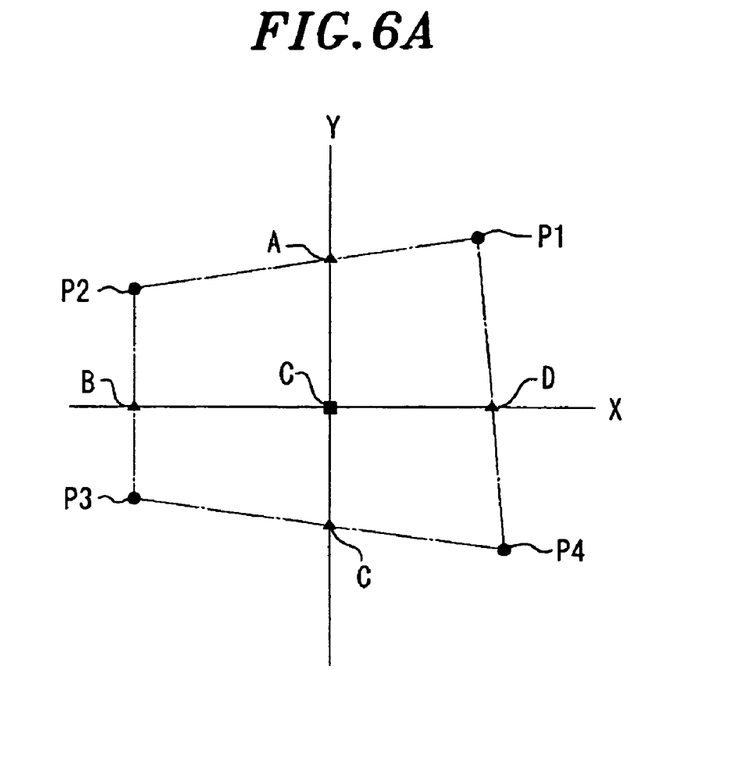
Figure 6B:
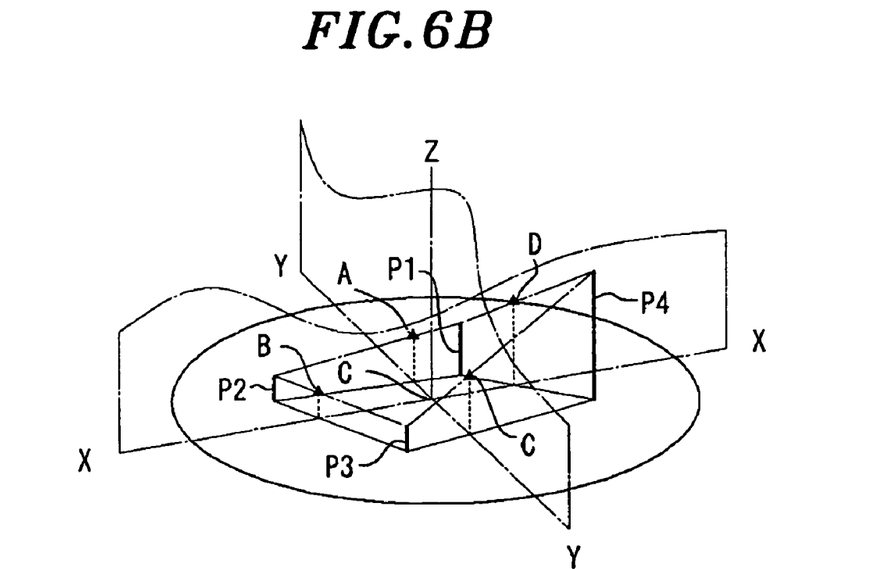
Figure 7:
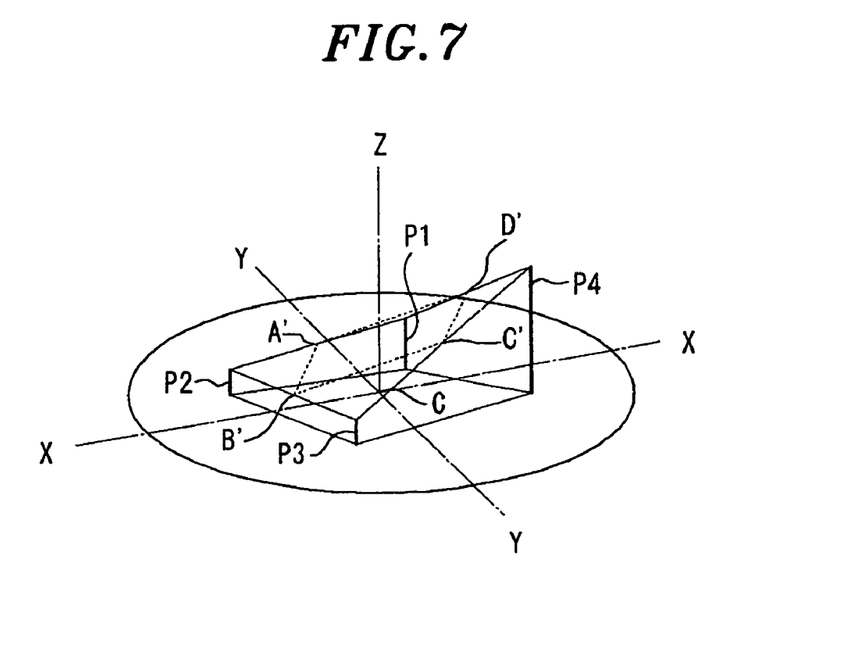
FIG. 7 is a figure, corresponding to FIG. 6B of the first preferred embodiment, for describing a method for adjusting a parallelism between a probe card and a mounting table in accordance with a second preferred embodiment of the present invention.
Figure 8:
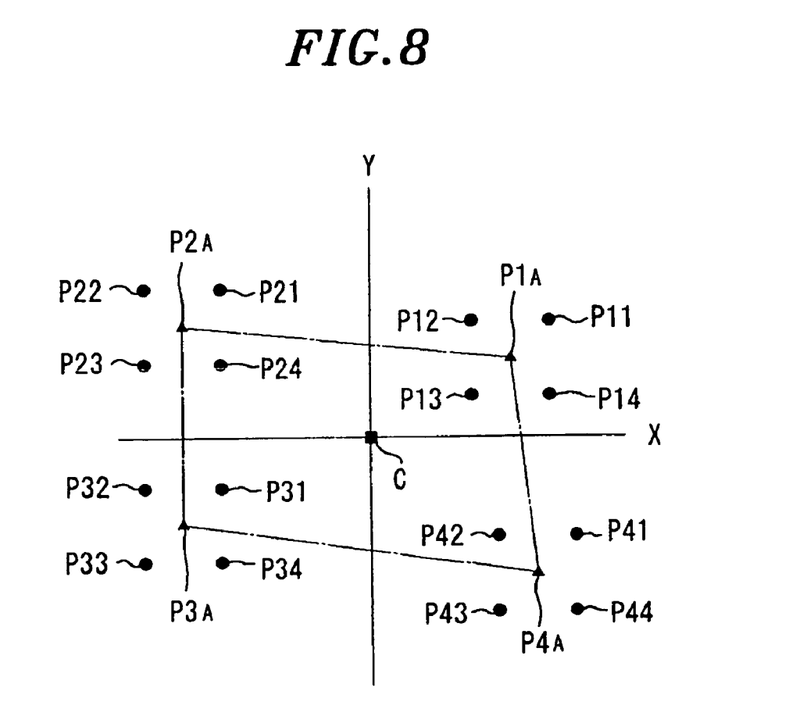
FIG. 8 is a figure, corresponding to FIG. 6A of the first preferred embodiment, for explaining a method for adjusting a parallelism between a probe card and a mounting table in accordance with a third preferred embodiment of the present invention.

Hereinafter, preferred embodiments of the present invention will be described with reference to FIGS. 1 to 8. FIG. 1 is a cross sectional view showing major components of an inspection apparatus in accordance with a first preferred embodiment of the present invention; FIG. 2 sets forth a plane view of a probe card adjusting mechanism of the inspection apparatus of FIG. 1; FIGS. 3A and 3B provide a cross sectional view and a plane view of the probe card adjusting mechanism of FIG. 2, respectively; FIG. 4 depicts a block diagram showing a configuration of major components of the inspection apparatus of FIG. 1; FIG. 5 is a flow chart describing a method for adjusting a parallelism between a probe card and a mounting table in accordance with the first preferred embodiment of the present invention; FIG. 6A shows an arrangement of tips of probe pins on X-Y coordinate system and FIG. 6B provides a conceptual view showing connections between the tips of the probe pins and their points of intersection with an X-Z plane and a Y-Z plane to explain the method for adjusting the parallelism between the probe card and the mounting table; FIG. 7 presents a diagram describing a method for adjusting a parallelism between a probe card and a mounting table in accordance with a second preferred embodiment of the present invention, which corresponds to FIG. 6B. FIG. 8 is a diagram describing a method for adjusting a parallelism between a probe card and a mounting table in accordance with a third preferred embodiment of the present invention, which corresponds to FIG. 6A of the first embodiment.

First Preferred Embodiment

An inspection apparatus used in the first preferred embodiment will be explained.

As shown in FIGS. 1 and 2, an inspection apparatus 10 includes: a probe card 11 provided with a plurality of probe pins 11A; a card clamp mechanism 12 fastening the probe card 11 via a card holder 11B; an insert ring 13 supporting the card clamp mechanism 12; a head plate 14 supporting the insert ring 13; and a probe card adjusting mechanism 16 installed between the insert ring 13 and the head plate 14, for adjusting a parallelism between the probe card 11 and a mounting table (wafer chuck) 15 located below the probe card 11. Under the control of a controller (see FIG. 4) equipped with a storage medium storing therein an inspection program, the parallelism between the probe card 11 and the wafer chuck 15 is automatically adjusted. Further, the head plate 14 is installed horizontally via a support member 17.

The probe card 11 is provided with the plurality of the probe pins 11A on its bottom surface, and all the probe pins 11A are brought into contact with plural devices formed on the substantially entire surface of a wafer W at a time. The wafer chuck 15 is moved in horizontal direction (XY-direction) and vertical direction (Z-direction), while holding the wafer W loaded thereon. The wafer chuck 15 has a tip height detection unit (for example, a charge coupled device (CCD) camera) 15A for optically detecting tip heights of the probe pins 11A. While the wafer chuck 15 is moved in X, Y directions below the probe card 11, the CCD camera 15A detects tip heights of the probe pins 11A at plural locations on the probe card 11 and stores wafer chuck 15's position coordinates corresponding to the plural locations of the probe pins in a memory unit of the controller. The position of the wafer chuck 15 is defined by position coordinates (X, Y, Z) on X-Y-Z coordinate system whose origin lies on a probe center located right below a center of the probe card 11. The probe card adjusting mechanism 16 is operated under the control of the controller based on the tip heights of the probe pins 11A detected by the CCD camera 15A, to thereby adjust the parallelism between the probe card 11 and a top surface (mounting surface) of the wafer chuck 15.

A hinge mechanism 18 is provided at an upper side (left side in FIG. 1) of a main body of the inspection apparatus 10, and a test head 50 is configured to be rotated onto the head plate 14 via the hinge mechanism 18. Also, a docking mechanism 19 is installed on a top surface of the insert ring 13, and the test head 50 is to be electrically connected with the probe card 11 via the docking mechanism 19.

The insert ring 13 is supported on a stepped portion formed along the circumferential surface of an opening provided at a substantially central portion of the head plate 14. Further, the probe card adjusting mechanism 16 interposed between the insert ring 13 and the head plate 14 is installed on the stepped portion of the head plate 14. By moving the insert ring 13 in the stepped portion upward and downward with respect to the head plate 14, the parallelism between the probe card 11 and the top surface (wafer W) of the wafer chuck 15 is adjusted.

A mother board 51 and a connection ring 52 are electrically connected to a bottom surface of the test head 50 in this order. A floating mechanism 53 is interposed between the test head 50 and the mother board 51, and the interval between the test head 50 and the mother board 51 can be controlled with accuracy within several millimeters. The docking mechanism 19 has a first member 19A attached on a top surface of the insert ring 13 and a second member 19B attached on a bottom surface of the mother board 51 outside the connection ring 52. A mechanical connection between the first and the second member 19A and 19B allows the probe card 11 and the test head 50 to be connected to each other electrically, as mentioned above. Further, a test head clamp mechanism 20 is attached on the head plate 14 such that it is located opposite to the hinge mechanism 18. The test head 50 is fixed on the inspection apparatus 10 via the test head clamp mechanism 20.

Further, in the inspection apparatus 10 in accordance with the first embodiment, the parallelism between the probe card 11 and the wafer W is adjusted by the probe card adjusting mechanism 16 under the control of the controller while the test head 50 and the probe card 11 are electrically connected via the docking mechanism 19.

Hereinafter, the probe card adjusting mechanism 16 will be explained in detail. As illustrated in FIGS. 1 and 2, the probe card adjusting mechanism 16 is interposed between the insert ring 13 and the head plate 14 to adjust the parallelism between the probe card 11 and the wafer chuck 15 located below the probe card 11. The probe card adjusting mechanism 16 has: a first support mechanism 161, disposed on a Y-Z plane of X-Y-Z coordinate system whose origin lies on a probe center, for supporting one point of the insert ring 13; and two second support mechanisms 162, disposed apart from the first support mechanism 161 along a circumference of the insert ring 13 such that they are symmetrically located with respect to the Y-Z plane of the X-Y-Z coordinate system, for supporting another two points of the insert ring 13. The first support mechanism 161 supports the insert ring 13 at a fixed height. Both second support mechanisms 162 are located on the head plate 14, and each of them has a wedge member 162A for elevating the insert ring 13. As shown in FIG. 2, the first support mechanism 161 has a globoid 161A for supporting the one point of the insert ring 13 at a reference height of the insert ring 13. Since the technical essence of the probe card adjusting mechanism 16 resides in the configuration and the operation of the second support mechanisms 162, detailed description of the second support mechanisms 162 will be provided hereafter with reference to FIGS. 3A and 3B.

As illustrated in FIGS. 3A and 3B, the second support mechanisms 162 are located on the head plate 14 and serve to move the insert ring 13 up and down. Each second support mechanism 162 has the wedge member 162A of a rectangular planar shape and a driving mechanism 162B for moving the wedge member 162A in a planar direction between the insert ring 13 and the head plate 14. The wedge member 162A is configured to be moved in a diametrical direction (in left-and-right direction in FIG. 3A) of the insert ring 13 by the driving mechanism 162B. The driving mechanism 162B is operated based on detection values (tip heights of probe pins 11A detected at plural locations) provided from the CCD camera 15A installed at the wafer chuck 15.

Referring to FIG. 3A, the bottom surface of the wedge member 162A contacts the head plate 14, and its top surface is formed as a sloped surface descending toward the inner side (left side) of the insert ring 13 from the outer side (right side) thereof. Further, an elevation assembly 162C is installed on the sloped surface of the wedge member 162A, and the bottom surface of the elevation assembly 162C is formed as a sloped surface inclined in a reverse direction to the sloped surface of the wedge member 162A. Accordingly, if the wedge member 162A is moved by the driving mechanism 162B in left-right direction as indicated by an arrow A in FIG. 3A, the elevation assembly 162C is moved up and down as indicated by an arrow B in the same figure.

As shown in FIGS. 3A and 3B, the elevation assembly 162C has: a main body 162D provided with the sloped bottom surface and with a circular-shaped recess on its top surface; a globoid 162E whose shaft is buried in the center of the recess of the main body 162D; a globe support 162G connected to the globoid 162E via a sliding member 162F such as a ball bearing, wherein the top surface of the globe support 162G is configured to contact the bottom surface of the insert ring 13. In this configuration, the elevation assembly 162C is elevated via the wedge member 162A to elevate the insert ring 13, during which the globe support 162G contacting the inserting ring 13 is made to rotate about the globoid 162E as indicated by an arrow C in FIG. 3A along the inclined direction of the insert ring 13 to be thereby inclined as well. Also, a frame body 162H having a bracket-like planar shape is installed at a certain end portion (right side end portion in FIGS. 3A and 3B) of the wedge member 162A to surround the end surface of the wedge member 162A and two lateral surfaces extended therefrom. The wedge member 162A is connected to the driving mechanism 162B via the frame body 162H.

The driving mechanism 162B has a motor 162I and a ball screw 162J attached to the motor 162I, wherein the ball screw 162J is fastened into a screw hole provided in the frame body 162H. If the motor 162I is driven, the wedge member 162A is moved in left-and-right direction via the frame body 162H connected with the ball screw 162J. Further, a pair of guide grooves 162K is formed at both sides of the wedge member 162A, one groove at each side, wherein the grooves are separated from each other, i.e., separated apart along the circumferential direction of the insert ring 13. Two oppositely facing sides of the frame body 162H are movably inserted into the guide grooves 162K, and the frame body 162H is configured to be moved straight along the guide grooves 162K. The guide grooves 162K are installed between a pair of cross roller guides 162L arranged in juxtaposition, and the wedge member 162A is configured to make reciprocating movement along the guide groove 162K in left-right direction within a range of, e.g., about ±12 mm from a reference position smoothly and with a high precision.

Further, a rail 162M is installed at a widthwise center of a left cross section of the main body 162D of the elevation assembly 162C such that it is elongated in vertical direction, and the rail 162M is engaged with a dovetail groove of an elevation guide member 162N installed to stand upright on the inner peripheral surface of the head plate 14. In this configuration, when the wedge member 162A reciprocates in left-and-right direction within a range of about ±12 mm from the reference position, the elevation assembly 162C is moved up and down on the sloped surface of the wedge member 162A along the elevation guide member 162N within a range of, e.g., ±0.6 mm.

When controlling the parallelism of the probe card 11, the two second support mechanisms 162 are respectively driven to elevate the insert ring 13 from an insert ring 13's reference height, the reference height being the height of the insert ring 13 when it is supported only by the first support mechanism 161, based on the detection result from the CCD camera 15A under the control of an inspection program, to thereby adjust the parallelism of the probe card 11 about the top surface of the wafer chuck 15. For example, in FIG. 2, if the two second support mechanisms 162 move the probe card 11 by a same amount in vertical direction, it is possible to change a Y-direction angle of the probe card 11 on a Y-Z plane without changing an X-direction angle of the probe card 11 in X-Z plane. Further, if the second support mechanisms 162 vertically move the probe card 11 in opposite directions from each other, it is possible to change the X-directional angle of the probe card 11 on an X-Z plane. Here, the probe card 11, the card clamp mechanism 12, the insert ring 13, the connection ring 52 and the mother board 51 are moved as a unit via the floating mechanism 53. That is, the motions of the probe card 11 and so forth are absorbed by the floating mechanism 53.

In the inspection apparatus 10, the wafer chuck 15 and the probe card adjusting mechanism 16 are controlled by a controller 21 with a computer, as shown in FIG. 4. The controller 21 includes a central processing unit 21A, an XY-direction driving control circuit 21B, a Z-direction driving control unit 21C, a probe card control circuit 21D and a memory unit 21E. The memory unit 21E stores therein an inspection program in accordance with the present invention. As for the operation of the controller 21, the central processing unit 21A reads the inspection program from the memory unit 21E, and the XY-direction driving control circuit 21B, the Z-direction driving control circuit 21C and the probe card control circuit 21D are operated based on commands from the central processing unit 21A. The XY-direction driving control circuit 21B is connected to an XY-direction driving mechanism 15B and moves the wafer chuck 15 in X-direction and Y-direction (horizontal direction) via the XY-direction driving mechanism 15B. The Z-direction driving control circuit 21C is connected to a Z-direction driving mechanism 15C and moves the wafer chuck 15 in Z-direction (vertical direction) via the Z-direction driving mechanism 15C. Further, the probe card control circuit 21D is connected to the probe card adjusting mechanism 16 and controls the parallelism between the probe card 11 and the top surface (mounting surface for a wafer W) wafer chuck 15 via the probe card adjusting mechanism 16.

In the following, a method for controlling a parallelism between a probe card and a mounting table in accordance with the first preferred embodiment of the present invention, which is performed by using the inspection apparatus 10, will be explained with reference to FIGS. 1 to 6.

Once the inspection apparatus 10 is driven, the controller 21 is operated in accordance with an inspection program to control each component of the inspection apparatus 10 as follows. First, the probe card 11 is loaded into the inspection apparatus 10. The card holder 11B of the probe card 11 is held by the card clamp mechanism 12, and the probe card 11 is fixed to a place located at a bottom surface side of the insert ring 13. Then, the test head 50 is rotated via the hinge mechanism 18, and when the test head 50 comes into a position where it is aligned with the head plate 14 in parallel, the docking mechanism 19 is operated, so that the test head 50 is electrically connected to the probe card 11 and, at the same time, the test head 50 is fixed on the top surface of the head plate 14 by the test head clamp mechanism 20.

When the electrical connection between the probe card 11 and the test head 50 is first established, the parallelism between the probe card 11 and the top surface of the wafer chuck 15 is not adjusted yet. Thus, the controller 21 drives and controls the probe card adjusting mechanism 16 via the probe card control circuit 21D in accordance with the inspection program to adjust the parallelism between the probe card 11 and the wafer chuck 15. That is, as described in FIG. 5, a first to a fourth probe pin P1 to P4 are selected such that they belong to a first to a fourth quadrant of X-Y coordinate system, respectively, whose origin is located at a probe center C shown in FIG. 6A (Step S1).

Subsequently, the wafer chuck 15 is moved in X, Y directions from the probe center C toward the first to the fourth probe pin P1 to P4 in order, and when the wafer chuck 15 is positioned right below each of the probe pins P1 to P4, it is moved in a Z-direction to detect corresponding probe pin by means of the CCD camera 15A. Afterward, the central processing unit 21A of the controller 21 calculates displacements of the wafer chuck 15 from the probe center C to the first to the fourth probe pin P1 to P4 in the X, Y, Z directions as position coordinates (X, Y, Z) of the first to the fourth probe pin P1 to P4, respectively (Step S2). Those position coordinates (X, Y, Z) are stored in the memory unit 21E. Based on the position coordinates (X, Y, Z) of the probe pins P1 to P4, tip heights of the probe pins P1 to P4 are defined in a three dimensional imaginary space of X-Y-Z coordinate system, as illustrated in FIG. 6B. If Z-coordinate values of the first to the fourth probe pin P1 to P4 are same, it implies that their tip heights are all same, which in turn indicates that the probe card 11 and the top surface of the wafer chuck 15 are arranged in parallel to each other. Therefore, without having to adjust the parallelism of the probe card 11, inspection of the wafer W is conducted. Here, in FIG. 6B, the reference notations P1 to P4 do not represent the lengths of the probe pins but they indicate the tip heights of the probe pins from an X-Y plane whose origin is located at the probe center C, which is also assumed in FIG. 7 to be described later.

However, it happens very frequently that the probe card 11 and the top surface of the wafer chuck 15 are not parallel to each other. In such a case, position coordinates (X, Y, Z) of an intersection point A of a connection line between the tips of the first and the second probe pin P1 and P2 with a Y-Z plane is obtained in the imaginary space of the X-Y-Z coordinate system by the central processing unit 21A (Step S3). Likewise, position coordinates (X, Y, Z) of an intersection point B of a connection line between the second and the third probe pin P2 and P3 with an X-Z plane are obtained (Step S4), and, also, position coordinates (X, Y, Z) of an intersection point C of a connection line between the third and the fourth probe pin P3 and P4 with the Y-Z plane are calculated (Step S5). Then, position coordinates (X, Y, Z) of an intersection point D of a connection line between the probe pin P4 and P1 with the X-Z plane are obtained (Step S6). The intersection points A to D can be assumed as tip heights of imaginary probe pins.

Subsequently, a difference between Z-coordinate values of the intersection point A and the intersection point C on the Y-Z plane is calculated (Step S7), and a difference between Z-coordinate values of the intersection point B and the intersection point D on the X-Z plane are also calculated (Step S8). Then, based on the difference between the Z-coordinate values of the intersection points A and C on the Y-Z plane, either one of the intersection points A and C (e.g., the intersection point C) is moved such that its Z-coordinate value coincides with the Z-coordinate value of the other (e.g., the intersection point A) (Step S9), thus making a connection line between the intersection points A and C parallel to back-and-forth direction (Y axis). Likewise, based on the difference between the Z-coordinate values of the intersection points B and D on the X-Z plane, the Z-coordinate value of one of the intersection points B and D (e.g., the intersection point B) is changed to coincide with that of the other intersection point (e.g., the intersection point D) (Step S10), such that a connection line between the intersection points B and D gets parallel to left-and-right direction (X axis). Subsequently, the tip heights of the four probe pins P1 to P4 are detected by means of the CCD camera 15A. If the tip heights are found to be out of a preset tolerance range, it is determined that the parallelism between the probe card 11 and the wafer chuck 15 is not sufficiently achieved. Then, the tip heights of the probe pins P1 to P4 are detected again by the CCD camera 15A, and the steps S2 to S10 are repeated until a desired level of parallelism between the probe card 11 and the wafer chuck 15 is obtained.

When the Z-direction displacements in the back-and-forth and the left-and-right directions are calculated by the central processing unit 21A, the central processing unit 21A sends control signals indicating the Z-direction displacements to the probe card control circuit 21D. Then, the probe card control circuit 21D sends the received control signals to the probe card adjusting mechanism 16, and the probe card adjusting mechanism 16 drives the motors 162I of the two second support mechanisms 162, thus allowing the respective wedge members 162A of the second support mechanisms 162 to be moved straight via the respective frame bodies 162H.

For example, in case the second support mechanism 162 receives a control signal commanding an ascent of the insert ring 13, its ball screw 162J is rotated, thus allowing the frame body 162H to be moved straight to the left along the guide groove 162K and the wedge member 162A to be moved straight to the left via the frame body 162H from a reference position. As the wedge member 162A moves straight to the left, the elevation assembly 162C is made to move vertically upward along the guide member 162N to thereby lift up the insert ring 13, while it is moved horizontally along the sloped surface of the wedge member 162A. Here, the insert ring 13 is lifted up from its reference position supported by the first support mechanism 161 so that it is inclined. At this time, the globe support 162G of the elevation assembly 162C is sloped via the globoid 162E in an inclined direction of the insert ring 13 while maintaining the contact with the insert ring 13, thus facilitating a smooth elevation of the insert ring 13 by a preset displacement. Though the load of the insert ring 13 changes due to the ascent of the elevation assembly 162C, the contact surface of the globe support 162G receives the load of the insert ring 13 after the ascent, so that control preciseness can be maintained stable during the inspection.

Furthermore, in case the second support mechanism 162 receives a control signal commanding a descent of the insert ring 13, the driving mechanism 162B is operated to move the components involved in directions opposite to those for ascending the insert ring 13. That is, the wedge member 162A is moved straight to the right, and the insert ring 13 is descended. The two second support mechanisms 162 are operated to move upward and downward in same or reverse directions while cooperating with the CCD camera 15A, whereby the parallelism between the insert ring 13 and the wafer chuck 15 can be controlled such that the two components are arranged parallel to each other.

After adjusting the parallelism of the probe card 11 by means of the probe card adjusting mechanism 16, the wafer chuck 15 is re-operated to detect tip heights of plural probe pins 11A of the probe card 11 by the CCD camera 15A, and it is investigated whether there is any difference of heights between the probe pins 11A. If there still are differences of heights therebetween, the above-described series of operations are repeated to further adjust the parallelism of the probe card 11. After completing the adjustment of the parallelism of the probe card 11, inspection of the wafer W is initiated. During the inspection, since the wafer W and the probe card 11 are aligned parallel to each other, all of the probe pins 11A of the probe card 11 can be brought into contact with the entire surface of the wafer W at a time at a uniform needle pressure, achieving a high-reliability inspection.

In accordance with the first preferred embodiment of the present invention as described above, the process for adjusting the parallelism between the probe card 11 and the wafer chuck 15 is controlled by the controller 21 in accordance with the inspection program, and the process involves the steps of: selecting the first to the fourth probe pin P1 to P4 from the X-Y coordinate system whose origin is located at the probe center C; detecting the tip heights of the first to the fourth probe pin P1 to P4 individually by means of the CCD camera 15A; calculating position coordinates (X,Y,Z) of each of the probe pins P1 to P4 by means of the central processing unit 21A; calculating the position coordinates (X,Y,Z) of the intersection point A of the first connection line connecting the tips of the first and the second probe pin P1 and P2 with the Y-Z plane, the position coordinates (X,Y,Z) of the intersection point B of the second connection line connecting the second and the third probe pin P2 and P3 with the X-Z plane, the position coordinates (X,Y,Z) of the intersection point C of the third connection line connecting the third and the fourth probe pin P3 and P4 with the Y-Z plane, and the position coordinates (X,Y,Z) of the intersection point D of the fourth connection line connecting the fourth and the first probe pin P4 and P1 with the X-Z plane, these position coordinates (X,Y,Z) being obtained as tip heights of imaginary probe pins; making the Z-coordinate values of the two intersection points A and C on the Y-Z plane identical; and making the Z-coordinate values of the two intersection point B and D on the X-Z plane identical. Thus, the parallelism between the probe card 11 and the wafer chuck 15 can be automatically adjusted simply and quickly just by measuring the tip heights of the first to the fourth probe p in P1 to P4 of the probe card 11.

Moreover, in accordance with the first preferred embodiment of the present invention, the inspection apparatus 10 includes the insert ring 13 supporting the probe card 11; the head plate 14 supporting the insert ring 13; the probe card adjusting mechanism 16, interposed between the insert ring 13 and the head plate 14, for adjusting the parallelism between the probe card 11 and the wafer W on the wafer chuck 15 located below the probe card 11; the CCD camera 15A for detecting the probe pins 11A; and the controller 21 for storing therein the inspection program for driving and controlling the probe card adjusting mechanism 16 based on the detection result from the CCD camera 15A. Further, the probe card adjusting mechanism 16 has: the first support mechanism 161 disposed on the Y-Z plane of the X-Y-Z coordinate system whose origin lies on the probe center C, for supporting a certain point of the insert ring 13; and the two second support mechanisms 162, disposed on the head plate 14 distanced away from first support mechanism 161 along the circumference of the head plate 14 such that they are symmetrically located in left-and-right direction with respect to the Y-Z plane of the X-Y-Z coordinate system, for supporting another two points of the insert ring 13. Each of the second support mechanisms 162 has the wedge member 162A for moving the insert ring 13 upward and downward. By using the probe card adjusting mechanism having the above configuration, the method for adjusting the parallelism between the probe card and the mounting table in accordance with the first embodiment can be performed effectively.

Second Preferred Embodiment

In the first preferred embodiment described above, the parallelism between the probe card 11 and the wafer chuck 15 is adjusted by calculating the intersection points A, B, C and D of the first to the fourth connection line, which connect the tips of the first to the fourth probe pin P1 to P4, with the Y-Z plane or the X-Z plane and then making the Z-coordinate values of the intersection points identical. However, in a second preferred embodiment of the present invention as shown in FIG. 7, four different probe pins P1 to P4 are selected from X-Y-Z coordinate system, and position coordinates (X,Y,Z) of middle points A', B', C' and D' of connection lines between tips of the probe pins P1 to P4 are obtained, and a parallelism between the probe card 11 and the wafer chuck 15 is adjusted based on these position coordinates (X,Y,Z). The method in accordance with the second preferred embodiment is performed by using the inspection apparatus 10 as described in the first preferred embodiment.

The method in accordance with the second preferred embodiment involves the steps of: detecting the tips of the first to the fourth probe pin P1 to P4 and calculating position coordinates (X,Y,Z) of each of them; calculating the position coordinates (X,Y,Z) of the middle points A', B', C' and D' of four sides formed by first to fourth connection lines connecting the tips of the first to the fourth probe p in P1 to P4; obtaining relational expressions between X, Y and Z coordinates defining imaginary planes including the four middle points A', B', C' and D'; and setting the imaginary lines to be parallel to the wafer chuck 15 by using the relational expressions. Here, since the four middle points A', B', C' and D' do not necessarily belong to a single plane, plural relational expressions are defined to adjust the parallelism between each of the plural imaginary planes and the wafer chuck 15, and to adjust the parallelism between the imaginary planes and the wafer chuck 15, the probe card adjusting mechanism 16 is operated in the same sequence as explained in the first preferred embodiment, after which the parallelism between the probe card 11 and the wafer chuck 15 is investigated again. The same effect as obtained in the first preferred embodiment can also be acquired in the second preferred embodiment.

Third Preferred Embodiment

In the first preferred embodiment, the first to the fourth probe pin P1 to P4 are selected from the first to the fourth quadrant of X-Y coordinate system, respectively. However, in a third preferred embodiment of the present invention, a plurality (four in this embodiment) of probe pins are selected from each quadrant as shown in FIG. 8, and average position coordinates $(X_A, Y_A, Z_A)$ of position coordinates $(X,Y,Z)$ of tips of the four probe pins in each quadrant are obtained. The probe pins of the average values are used instead of the first to the fourth probe pin P1 to P4 in the first preferred embodiment. The other processing steps are identical to those described in the first preferred embodiment. The probe pins of the average values are defined as imaginary probe pins in this embodiment.

Specifically, as shown in FIG. 8, four probe pins 11A are selected from a first to a fourth quadrant of X-Y coordinate system whose origin lies on a probe center C. In the first quadrant, probe pins P11 to P14 are selected, and average position coordinates $(X_{1A}, Y_{1A}, Z_{1A})$ of tip position coordinates $(X,Y,Z)$ of each of the probe pins P11 to P14 are calculated, thus obtaining a first imaginary probe pin $P_{1A}$. Likewise, probe pins P21 to P24, P31 to P34 and P41 to P44 are selected from the second to the fourth quadrant, respectively, and a second to a fourth imaginary probe pin $P_{2A}$ to $P_{4A}$ are defined. Given that the four imaginary probe pins $P_{1A}$ to $P_{4A}$ have the average position coordinates $(X_{1A}, Y_{1A}, Z_{1A})$ to $(X_{4A}, Y_{4A}, Z_{4A})$, they correspond to the probe pins P1 to P4 in the first preferred embodiment. The other processing steps are identical to those described in the first preferred embodiment, and the parallelism between the probe chard 11 and the wafer chuck 15 can be adjusted by employing the same processing sequence as in the first preferred embodiment. In accordance with the third preferred embodiment of the present invention, since the parallelism of the probe card 11 is adjusted by using more probe pins than in the first preferred embodiment, a higher-precision adjustment is possible. In fact, the precision for the adjustment of the parallelism can be improved as the number of the probe pins 11A used increases.

Though the above preferred embodiments of the present invention have been described for the case of selecting probe pins from a first to a fourth quadrant of X-Y coordinate system whose origin is located at a probe center C, the probe pins may not be selected from each of the quadrants. For example, probe pins can be selected from plural different locations on X-Y coordinate system whose origin lies on the probe center C. Then, tips of the plural probe pins are detected and their position coordinates $(X,Y,Z)$ are calculated. Thereafter, preset points are selected from connection lines connecting the tips of the closest neighboring probe pins, and these points are calculated as position coordinates $(X,Y,Z)$ of tips of imaginary probe pins. Then, based on the position coordinates $(X,Y,Z)$ of the tips of the imaginary probe pins, the slope of the probe card with respect to the wafer chuck is calculated, and the parallelism between the probe card and the wafer chuck is adjusted based on the calculation result. Here, the preset points may not be intersection points of the connection lines with a Y-Z or X-Z plane or middles points of the connection lines. Further, though a wafer W is exemplified as an object to be inspected in the above preferred embodiments, the object to be inspected is not limited thereto. For example, it can be a glass substrate for LCD or the like.

The present invention as described above has many advantages when it is applied to an inspection apparatus.

While the invention has been shown and described with respect to the preferred embodiments, it will be understood by those skilled in the art that various changes and modifications may be made without departing from the scope of the invention as defined in the following claims.

What is claimed is:

1. A method for controlling parallelism between a probe card and a mounting table when inspecting electrical characteristics of a target object by allowing the probe card having a number of probe pins to electrically contact the target object on the mounting table, the method comprising:

a first step of selecting, among the probe pins, one or more probe pins corresponding to each of plural distinct locations on an X-Y coordinate system whose origin lies at a probe center;

a second step of detecting a tip of each of the selected probe pins and obtaining position coordinates $(X,Y,Z)$ thereof;

a third step of selecting a specific point on each of connection lines connecting tips of neighboring selected probe pins, the specific point being located between the probe pins defining the line on which the specific point is located, and calculating position coordinates of the specific points on the connection lines, wherein the position coordinates of the specific points are set as position coordinates $(X,Y,Z)$ of tips of imaginary probe pins; and a fourth step of adjusting the parallelism between the probe card and the mounting table based on the position coordinates $(X,Y,Z)$ of the tips of the imaginary probe pins.

2. The method of claim 1, wherein the fourth step includes the steps of:

calculating a slope of the probe card with respect to the mounting table based on the position coordinates $(X,Y,Z)$ of the imaginary probe pins; and adjusting the parallelism between the probe card and the mounting table based on the calculated slope.

3. A method for controlling parallelism between a probe card and a mounting table when inspecting electrical characteristics of a target object by allowing the probe card having a number of probe pins to electrically contact the target object on the mounting table, the method comprising:

a first step of selecting, among the probe pins, one or more probe pins corresponding to each of plural distinct locations on an X-Y coordinate system whose origin lies at a probe center;

a second step of detecting a tip of each of the selected probe pins and obtaining position coordinates $(X,Y,Z)$ thereof;

a third step of selecting a specific point on each of connection lines connecting tips of neighboring selected probe pins and calculating position coordinates of the specific points on the connection lines, wherein the position coordinates of the specific points are set as position coordinates $(X,Y,Z)$ of tips of imaginary probe pins; and a fourth step of adjusting the parallelism between the probe card and the mounting table based on the position coordinates $(X,Y,Z)$ of the tips of the imaginary probe pins, wherein in the first step, probe pins are respectively selected from a first to a fourth quadrant of the X-Y coordinate system;

in the second step, position coordinates $(X,Y,Z)$ of tips of the probe pins selected from the first to the fourth quadrant are obtained;

in the third step, intersection points of connection lines connecting the tips of the selected probe pins with an X-Z plane or a Y-Z plane relative to the X-Y coordinate system are selected as the specific points and position coordinates of the intersection points on the X-Z or the Y-Z plane are calculated and set as the position coordinates (X,Y,Z) of the tips of imaginary probe pins; and in the fourth step, Z-coordinate values of the tips of the imaginary probe pins on the X-Z or the Y-Z plane are adjusted to be made identical.

4. The method of claim 3, further comprising, between the third and the fourth step, the step of calculating a difference of Z-coordinate values of the tips of the imaginary probe pins on the X-Z plane and a difference of Z-coordinate values of the tips of the imaginary probe pins on the Y-Z plane.

5. A method for controlling parallelism between a probe card and a mounting table when inspecting electrical characteristics of a target object by allowing the probe card having a number of probe pins to electrically contact the target object on the mounting table, the method comprising:

a first step of selecting, among the probe pins, one or more probe pins corresponding to each of plural distinct locations on an X-Y coordinate system whose origin lies at a probe center;

a second step of detecting a tip of each of the selected probe pins and obtaining position coordinates (X,Y,Z) thereof;

a third step of selecting a specific point on each of connection lines connecting tips of neighboring selected probe pins and calculating position coordinates of the specific points on the connection lines, wherein the position coordinates of the specific points are set as position coordinates (X,Y,Z) of tips of imaginary probe pins; and a fourth step of adjusting the parallelism between the probe card and the mounting table based on the position coordinates (X,Y,Z) of the tips of the imaginary probe pins, wherein in the third step, middle points of line segments connecting the tips of the neighboring probe pins are selected as the specific points and position coordinates of the middle points are calculated and set as the position coordinates (X,Y,Z) of the tips of the imaginary probe pins; and in the fourth step, a relational expression representing an imaginary plane including the tips of the imaginary probe pins is obtained and parallelism between the imaginary plane and the mounting table is adjusted by using the relational expression.

6. The method of claim 1, wherein in the first step, two or more probe pins are selected from each of the distinct locations; and the method further comprising, between the second and the third step, the step of obtaining average position coordinates (X,Y,Z) of tips of the two or more probe pins and setting the average position coordinates (X,Y,Z) as position coordinates of the tips of the probe pins to be used in constructing the connecting lines in the third step.

7. A storage medium storing an inspection program for driving a computer to adjust parallelism between a probe card and a mounting table when inspecting electrical characteristics of a target object by allowing the probe card having a number of probe pins to contact the target object on the mounting table, wherein the inspection program drives the computer to execute a method comprising:

a first step of selecting, among the probe pins, one or more probe pins corresponding to each of plural distinct locations on an X-Y coordinate system whose origin lies at a probe center;

a second step of detecting a tip of each of the selected probe pins and obtaining position coordinates (X,Y,Z) thereof;

a third step of selecting a specific point on each of connection lines connecting tips of neighboring selected probe pins, the specific point being located between the probe pins defining the line on which the specific point is located, and calculating position coordinates of the specific points on the connection lines, wherein the position coordinates of the specific points are set as position coordinates (X,Y,Z) of tips of imaginary probe pins; and a fourth step of adjusting the parallelism between the probe card and the mounting table based on the position coordinates (X,Y,Z) of the tips of the imaginary probe pins.

8. The storage medium of claim 7, wherein the fourth step includes the steps of:

calculating a slope of the probe card with respect to the mounting table based on the position coordinates (X,Y,Z) of the imaginary probe pins; and adjusting the parallelism between the probe card and the mounting table based on the calculated slope.

9. A storage medium storing an inspection program for driving a computer to adjust parallelism between a probe card and a mounting table when inspecting electrical characteristics of a target object by allowing the probe card having a number of probe pins to contact the target object on the mounting table, wherein the inspection program drives the computer to execute a method comprising:

a first step of selecting, among the probe pins, one or more probe pins corresponding to each of plural distinct locations on an X-Y coordinate system whose origin lies at a probe center;

a second step of detecting a tip of each of the selected probe pins and obtaining position coordinates (X,Y,Z) thereof;

a third step of selecting a specific point on each of connection lines connecting tips of neighboring selected probe pins and calculating position coordinates of the specific points on the connection lines, wherein the position coordinates of the specific points are set as position coordinates (X,Y,Z) of tips of imaginary probe pins; and a fourth step of adjusting the parallelism between the probe card and the mounting table based on the position coordinates (X,Y,Z) of the tips of the imaginary probe pins, wherein in the first step, probe pins are respectively selected from a first to a fourth quadrant of the X-Y coordinate system;

in the second step, position coordinates (X,Y,Z) of tips of the probe pins selected from the first to the fourth quadrant are obtained;

in the third step, intersection points of connection lines connecting the tips of the selected probe pins with an X-Z plane or a Y-Z plane relative to the X-Y coordinate system are selected as the specific points and position coordinates of the intersection points on the X-Z or the Y-Z plane are calculated and set as the position coordinates (X,Y,Z) of the tips of imaginary probe pins; and in the fourth step, Z-coordinate values of the tips of the imaginary probe pins on the X-Z or the Y-Z plane are adjusted to be made identical.

10. The storage medium of claim 9, the method further comprising, between the third and the fourth step, the step of calculating a difference of Z-coordinate values of the tips of the imaginary probe pins on the X-Z plane and a difference of Z-coordinate values of the tips of the imaginary probe pins on the Y-Z plane.

11. A storage medium storing an inspection program for driving a computer to adjust parallelism between a probe card and a mounting table when inspecting electrical characteristics of a target object by allowing the probe card having a number of probe pins to contact the target object on the mounting table, wherein the inspection program drives the computer to execute a method comprising:
- a first step of selecting, among the probe pins, one or more probe pins corresponding to each of plural distinct locations on an X-Y coordinate system whose origin lies at a probe center;
- a second step of detecting a tip of each of the selected probe pins and obtaining position coordinates (X,Y,Z) thereof;
- a third step of selecting a specific point on each of connection lines connecting tips of neighboring selected probe pins and calculating position coordinates of the specific points on the connection lines, wherein the position coordinates of the specific points are set as position coordinates (X,Y,Z) of tips of imaginary probe pins; and
- a fourth step of adjusting the parallelism between the probe card and the mounting table based on the position coordinates (X,Y,Z) of the tips of the imaginary probe pins.
- wherein in the third step, middle points of line segments connecting the tips of the neighboring probe pins are selected as the specific points and position coordinates of the middle points are calculated and set as the position coordinates (X,Y,Z) of the tips of the imaginary probe pins; and
- in the fourth step, a relational expression representing an imaginary plane including the tips of the imaginary probe pins is obtained and parallelism between the imaginary plane and the mounting table is adjusted by using the relational expression.

12. The storage medium of claim 7, wherein in the first step, two or more probe pins are selected from each of the distinct locations; and
- the method further comprising, between the second and the third step, the step of obtaining average position coordinates (X,Y,Z) of tips of the two or more probe pins and setting the average position coordinates (X,Y,Z) as position coordinates of the tips of the probe pins to be used in constructing the connecting lines in the third step.

13. An inspection apparatus comprising:
- an insert ring for supporting a probe card provided with a number of probe pins;
- a head plate supporting the insert ring;
- a probe card adjusting mechanism, disposed between the insert ring and the head plate, for adjusting a parallelism between the probe card and a mounting table located below the probe card;
- a detection unit for detecting positions of tips of the probe pins; and
- a controller storing an inspection program for controlling the probe card adjusting mechanism based on a detection result from the detection unit,
- wherein the probe card adjusting mechanism includes:
- a first support mechanism supporting a part of the insert ring; and
- plural second support mechanisms, respectively disposed apart from the first support mechanism along a circumferential direction of the insert ring, for supporting other parts of the insert ring, each of the second support mechanisms having a wedge member for elevating the insert ring, the wedge member being installed on the head plate; and
- the controller drives the probe card adjusting mechanism based on the inspection program to thereby execute the method for adjusting the parallelism between the probe card and the mounting table described in claim 1.

14. The inspection apparatus of claim 13, wherein the first support mechanism is disposed on a Y-Z plane of an X-Y-Z coordinate system whose origin lies on the probe center, and the second support mechanisms are disposed symmetrically with respect to the Y-Z plane of the X-Y-Z coordinate system.

* * * * *